US010110187B1

(12) United States Patent
Luebs et al.

(10) Patent No.: US 10,110,187 B1
(45) Date of Patent: Oct. 23, 2018

(54) MIXTURE MODEL BASED SOFT-CLIPPING DETECTION

(71) Applicant: GOOGLE LLC, Mountain View, CA (US)

(72) Inventors: Alejandro Luebs, San Francisco, CA (US); Fritz Obermeyer, Berkeley, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/632,498

(22) Filed: Jun. 26, 2017

(51) Int. Cl.
*H03G 1/02* (2006.01)
*H03G 3/04* (2006.01)
*H03G 7/00* (2006.01)
*G06F 3/16* (2006.01)

(52) U.S. Cl.
CPC .............. *H03G 7/007* (2013.01); *G06F 3/165* (2013.01)

(58) Field of Classification Search
CPC ........ H03G 11/00; H04R 25/356; G10L 21/02
USPC .......................................... 381/104–107, 109
See application file for complete search history.

(56) References Cited

U.S. PATENT DOCUMENTS

| 6,801,895 | B1 | 10/2004 | Huang et al. |
| 8,392,199 | B2 | 3/2013 | Otani et al. |
| 9,426,592 | B2 | 8/2016 | Skoglund et al. |
| 2009/0245539 | A1* | 10/2009 | Vaudrey ................ H03G 7/002 381/109 |
| 2010/0030555 | A1 | 2/2010 | Otani et al. |
| 2014/0226829 | A1 | 8/2014 | Skoglund et al. |

OTHER PUBLICATIONS

Aleinik, Sergei et al; "Detection of Clipped Fragments in Speech Signals"; World Academy of Science, Engineering and Technology; International Journal of Electrical, Computer, Energetic, Electronic and Communication Engineering; vol. 8, No. 2, 2014; p. 286-292.
Laguna, Christopher et al., "An Efficient Algorithm for Clipping Detection and Declipping Audio"; Center for Music Technology, Georgia Institute of Technology, Atlanta, GA; 2016; 1-10.
Fraser et al; "Detection of ADC Clipping, Quantization Noise, and Amplifier Saturation in Surface Electromyography"; Medical Measurements and Applications Proceedings; IEEE International Symposium on IEEE; May 18, 2012; pp. 1-5.
International Search Report and Written Opinion for International Application No. PCT/US2018/022623, dated May 11, 2018.

* cited by examiner

*Primary Examiner* — George C Monikang
(74) *Attorney, Agent, or Firm* — Young Basile Hanlon & MacFarlane, P.C.

(57) ABSTRACT

Mixture model based soft-clipping detection includes receiving input audio samples, generating soft-clipping information indicating whether the input audio samples include soft-clipping distortion, and outputting the soft-clipping information. Generating the soft-clipping information includes fitting a mixture model to the input audio samples, wherein fitting the mixture model to the input audio samples includes generating a fitted mixture model, such that the fitted mixture model has fitted parameters, and evaluating a soft-clipping distortion metric based on the parameters of the fitted mixture model, wherein evaluating the soft-clipping distortion metric includes identifying a soft-clipping distortion value.

18 Claims, 6 Drawing Sheets

MIXTURE MODEL BASED SOFT-CLIPPING DETECTION

BACKGROUND

Digital audio can be used, for example, for remote business meetings via audio, or audio-video, conferencing, high definition audio, or audio-video, entertainment, or sharing of user-generated audio, or audio-video content. Digital signal processing, such as digital audio processing may include processing audio signals to maximize quality and encoding efficiency. Accordingly, it would be advantageous to provide digital signal processing including mixture model based soft-clipping detection.

SUMMARY

This application relates to processing audio data. Disclosed herein are aspects of systems, methods, and apparatuses for processing audio data using mixture model based soft-clipping detection.

An aspect of the disclosed implementations is a method for mixture model based soft-clipping detection, which includes receiving input audio samples, generating soft-clipping information indicating whether the input audio samples include soft-clipping distortion, and outputting the soft-clipping information. Generating the soft-clipping information includes fitting a mixture model to the input audio samples, wherein fitting the mixture model to the input audio samples includes generating a fitted mixture model, such that the fitted mixture model has fitted parameters, and evaluating a soft-clipping distortion metric based on the parameters of the fitted mixture model, wherein evaluating the soft-clipping distortion metric includes identifying a soft-clipping distortion value.

Another aspect is a method for mixture model based soft-clipping detection, which includes receiving an input data signal, wherein the input data signal includes input audio samples, generating soft-clipping information indicating whether the input audio samples include soft-clipping distortion, and outputting the soft-clipping information. Generating the soft-clipping information includes, fitting a mixture model to the input audio samples.

Another aspect is a method for mixture model based soft-clipping detection, which includes receiving an input data signal, wherein the input data signal includes input audio samples and generating soft-clipping information for the input data signal. Generating the soft-clipping information includes identifying a mixture model including a Laplacian distribution having a zero mean, a first Gaussian distribution, and a second Gaussian distribution, wherein the first Gaussian distribution and the second Gaussian distribution are symmetrical. Generating the soft-clipping information includes identifying a sequence of temporal portions of the input audio samples, and, for each temporal portion from the sequence of temporal portions, generating a respective fitted mixture model by fitting the mixture model to the respective input audio samples from the temporal portion using expectation maximization, generating respective soft-clipping information indicating whether the temporal portion includes soft-clipping distortion by evaluating a soft-clipping distortion metric based on the parameters of the respective fitted mixture model, wherein, in response to a determination that the temporal portion includes soft-clipping distortion, generating the respective soft-clipping information includes identifying a respective soft-clipping distortion value indicating a severity of the soft-clipping distortion for the respective input audio samples from the temporal portion, and including the respective soft-clipping information for the temporal portion in the soft-clipping information for the input data signal. Generating the soft-clipping information includes generating an average soft-clipping distortion value for the input data signal, including the average soft-clipping distortion value for the input data signal in the soft-clipping information for the input data signal, identifying a maximum soft-clipping distortion value for the input data signal, and including the maximum soft-clipping distortion value for the input data signal in the soft-clipping information for the input data signal. The method includes outputting the soft-clipping information for the input data signal.

Variations in these and other aspects are described herein, such as in the following detailed description, the appended claims, and the accompanying figures.

BRIEF DESCRIPTION OF THE DRAWINGS

The description herein makes reference to the accompanying drawings wherein like reference numerals refer to like parts throughout the several views.

DETAILED DESCRIPTION

An audio signal may be represented digitally by periodically sampling, or measuring, one or more characteristics of the audio signal, such as an amplitude of the audio signal, and storing, or otherwise outputting, a sequence of digital samples representing the audio signal. The digital samples may have a limited range of available values. For example, digital audio samples may be represented using sixteen-bit signed integers, which may have a range of available values from −32768 to 32767. One or more portions of an audio signal may be clipped, or may include clipping distortion, which may distort the audio content represented by the audio signal. For example, a digital audio signal may include hard-clipping, soft-clipping, or both.

Hard-clipping may include distortion wherein a value, such as an amplitude, of a portion of an input audio signal, such as one or more samples, exceeds an available range of representative values and is inaccurately represented by a maximum, or minimum, value in the captured audio signal, such as in a digital audio signal, or otherwise truncated to be within the available range. Hard-clipping may be detected by identifying portions, or sequences of portions, of the digital audio signal represented by values at the limits of the available range.

Soft-clipping may include distortion wherein a value, such an amplitude, of a portion, such as a sample, or a sequence of samples, which may be a relatively high amplitude portion, is compressed. Audio signals distorted by soft-clipping may be within the available range of representative values. Histogram based soft-clipping detection may include computing a histogram of the signal samples and determining a distance of a maximally distant point from a center of the histogram such that the value of the maximally distant point is greater than the other values of the histogram as an indication of soft-clipping. Histogram based soft-clipping detection may inaccurately or inefficiently detect soft-clipping.

Mixture model based soft-clipping detection may include fitting, such as using expectation maximization, a mixture model, such as a mixture of a Laplacian distribution having a zero mean and two symmetrical Gaussian distributions, to audio samples of an input audio signal to identify fitted model parameters, and evaluating the fitted model parameters to detect and measure soft-clipping distortion. The fitted model parameters may be evaluated based on defined metrics or may be evaluated using a machine learning algorithm trained on training data, such as manually labeled input signals. Temporal portions, such as one-second portions, of an input audio signal may be evaluated independently, relative to the input audio signal, or both.

Figure 1:
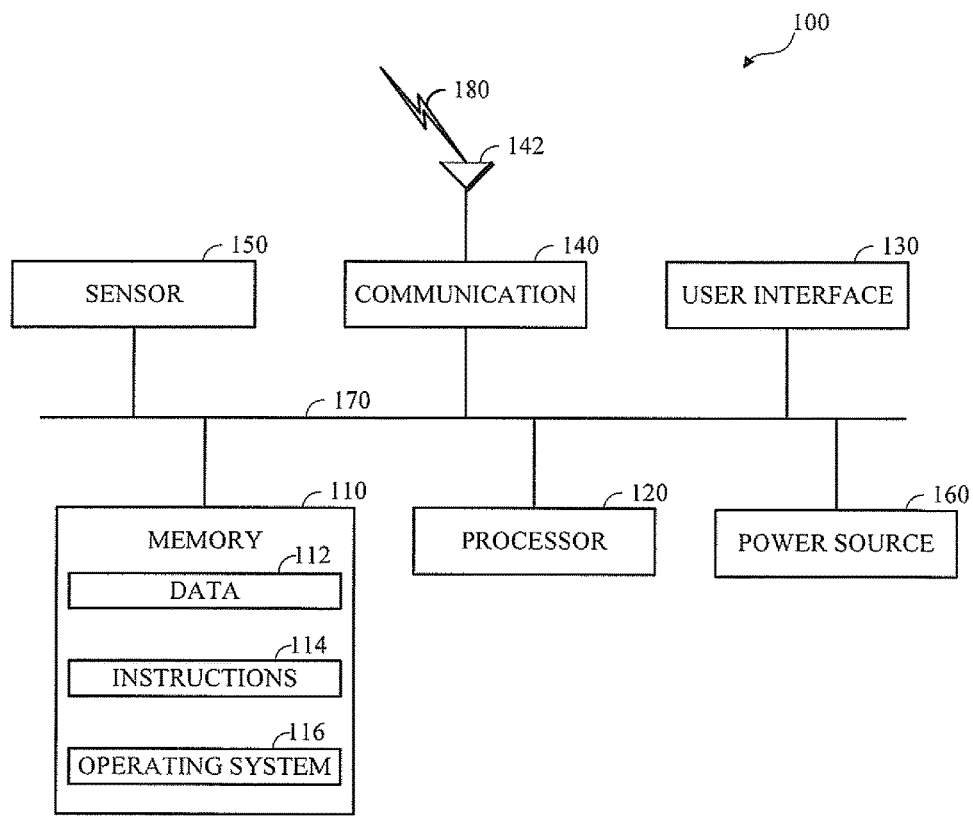
FIG. 1 is a diagram of a computing device in accordance with implementations of this disclosure.

FIG. 1 is a diagram of a computing device 100 in accordance with implementations of this disclosure. The computing device 100 shown includes a memory 110, a processor 120, a user interface (UI) 130, an electronic communication unit 140, a sensor 150, a power source 160, and a bus 170. As used herein, the term "computing device" includes any unit, or a combination of units, capable of performing any method, or any portion or portions thereof, disclosed herein.

The computing device 100 may be a stationary computing device, such as a personal computer (PC), a server, a workstation, a minicomputer, or a mainframe computer; or a mobile computing device, such as a mobile telephone, a personal digital assistant (PDA), a laptop, or a tablet PC. Although shown as a single unit, any one or more element of the computing device 100 can be integrated into any number of separate physical units. For example, the user interface 130 and processor 120 can be integrated in a first physical unit and the memory 110 can be integrated in a second physical unit.

The memory 110 can include any non-transitory computer-usable or computer-readable medium, such as any tangible device that can, for example, contain, store, communicate, or transport data 112, instructions 114, an operating system 116, or any information associated therewith, for use by or in connection with other components of the computing device 100. The non-transitory computer-usable or computer-readable medium can be, for example, a solid state drive, a memory card, removable media, a read-only memory (ROM), a random-access memory (RAM), any type of disk including a hard disk, a floppy disk, an optical disk, a magnetic or optical card, an application-specific integrated circuits (ASICs), or any type of non-transitory media suitable for storing electronic information, or any combination thereof.

Although shown a single unit, the memory 110 may include multiple physical units, such as one or more primary memory units, such as random-access memory units, one or more secondary data storage units, such as disks, or a combination thereof. For example, the data 112, or a portion thereof, the instructions 114, or a portion thereof, or both, may be stored in a secondary storage unit and may be loaded or otherwise transferred to a primary storage unit in conjunction with processing the respective data 112, executing the respective instructions 114, or both. In some implementations, the memory 110, or a portion thereof, may be removable memory.

The data 112 can include information, such as input audio data, encoded audio data, decoded audio data, or the like. The instructions 114 can include directions, such as code, for performing any method, or any portion or portions thereof, disclosed herein. The instructions 114 can be realized in hardware, software, or any combination thereof. For example, the instructions 114 may be implemented as information stored in the memory 110, such as a computer program, that may be executed by the processor 120 to perform any of the respective methods, algorithms, aspects, or combinations thereof, as described herein.

Although shown as included in the memory 110, in some implementations, the instructions 114, or a portion thereof, may be implemented as a special purpose processor, or circuitry, that can include specialized hardware for carrying out any of the methods, algorithms, aspects, or combinations thereof, as described herein. Portions of the instructions 114 can be distributed across multiple processors on the same machine or different machines or across a network such as a local area network, a wide area network, the Internet, or a combination thereof.

The processor 120 can include any device or system capable of manipulating or processing a digital signal or other electronic information now-existing or hereafter developed, including optical processors, quantum processors, molecular processors, or a combination thereof. For example, the processor 120 can include a special purpose processor, a central processing unit (CPU), a digital signal processor (DSP), a plurality of microprocessors, one or more microprocessor in association with a DSP core, a controller, a microcontroller, an Application Specific Integrated Circuit (ASIC), a Field Programmable Gate Array (FPGA), a programmable logic array, programmable logic controller, microcode, firmware, any type of integrated circuit (IC), a state machine, or any combination thereof. As used herein, the term "processor" includes a single processor or multiple processors.

The user interface 130 can include any unit capable of interfacing with a user, such as a virtual or physical keypad, a touchpad, a display, a touch display, a speaker, a microphone, a video camera, a sensor, or any combination thereof. For example, the user interface 130 may be an audio-visual display device, and the computing device 100 may present audio, such as decoded audio, using the user interface 130 audio-visual display device, such as in conjunction with displaying video, such as decoded video. Although shown as a single unit, the user interface 130 may include one or more physical units. For example, the user interface 130 may include an audio interface for performing audio communication with a user, and a touch display for performing visual and touch-based communication with the user.

The electronic communication unit 140 can transmit, receive, or transmit and receive signals via a wired or wireless electronic communication medium 180, such as a radio frequency (RF) communication medium, an ultraviolet (UV) communication medium, a visible light communication medium, a fiber optic communication medium, a wireline communication medium, or a combination thereof. For example, as shown, the electronic communication unit 140 is operatively connected to an electronic communication interface 142, such as an antenna, configured to communicate via wireless signals.

Although the electronic communication interface 142 is shown as a wireless antenna in FIG. 1, the electronic communication interface 142 can be a wireless antenna, as shown, a wired communication port, such as an Ethernet port, an infrared port, a serial port, or any other wired or wireless unit capable of interfacing with a wired or wireless electronic communication medium 180. Although FIG. 1 shows a single electronic communication unit 140 and a single electronic communication interface 142, any number of electronic communication units and any number of electronic communication interfaces can be used.

The sensor 150 may include, for example, an audio-sensing device, a visible light-sensing device, a motion sensing device, or a combination thereof. For example, 100 the sensor 150 may include a sound-sensing device, such as a microphone, or any other sound-sensing device now existing or hereafter developed that can sense sounds in the proximity of the computing device 100, such as speech or other utterances, made by a user operating the computing device 100. In another example, the sensor 150 may include a camera, or any other image-sensing device now existing or hereafter developed that can sense an image such as the image of a user operating the computing device. Although a single sensor 150 is shown, the computing device 100 may include a number of sensors 150. For example, the computing device 100 may include a first camera oriented with a field of view directed toward a user of the computing device 100 and a second camera oriented with a field of view directed away from the user of the computing device 100.

The power source 160 can be any suitable device for powering the computing device 100. For example, the power source 160 can include a wired external power source interface; one or more dry cell batteries, such as nickel-cadmium (NiCd), nickel-zinc (NiZn), nickel metal hydride (NiMH), lithium-ion (Li-ion); solar cells; fuel cells; or any other device capable of powering the computing device 100. Although a single power source 160 is shown in FIG. 1, the computing device 100 may include multiple power sources 160, such as a battery and a wired external power source interface.

Although shown as separate units, the electronic communication unit 140, the electronic communication interface 142, the user interface 130, the power source 160, or portions thereof, may be configured as a combined unit. For example, the electronic communication unit 140, the electronic communication interface 142, the user interface 130, and the power source 160 may be implemented as a communications port capable of interfacing with an external display device, providing communications, power, or both.

One or more of the memory 110, the processor 120, the user interface 130, the electronic communication unit 140, the sensor 150, or the power source 160, may be operatively coupled via a bus 170. Although a single bus 170 is shown in FIG. 1, a computing device 100 may include multiple buses. For example, the memory 110, the processor 120, the user interface 130, the electronic communication unit 140, the sensor 150, and the bus 170 may receive power from the power source 160 via the bus 170. In another example, the memory 110, the processor 120, the user interface 130, the electronic communication unit 140, the sensor 150, the power source 160, or a combination thereof, may communicate data, such as by sending and receiving electronic signals, via the bus 170.

Although not shown separately in FIG. 1, one or more of the processor 120, the user interface 130, the electronic communication unit 140, the sensor 150, or the power source 160 may include internal memory, such as an internal buffer or register. For example, the processor 120 may include internal memory (not shown) and may read data 112 from the memory 110 into the internal memory (not shown) for processing.

Although shown as separate elements, the memory 110, the processor 120, the user interface 130, the electronic communication unit 140, the sensor 150, the power source 160, and the bus 170, or any combination thereof can be integrated in one or more electronic units, circuits, or chips.

Figure 2:
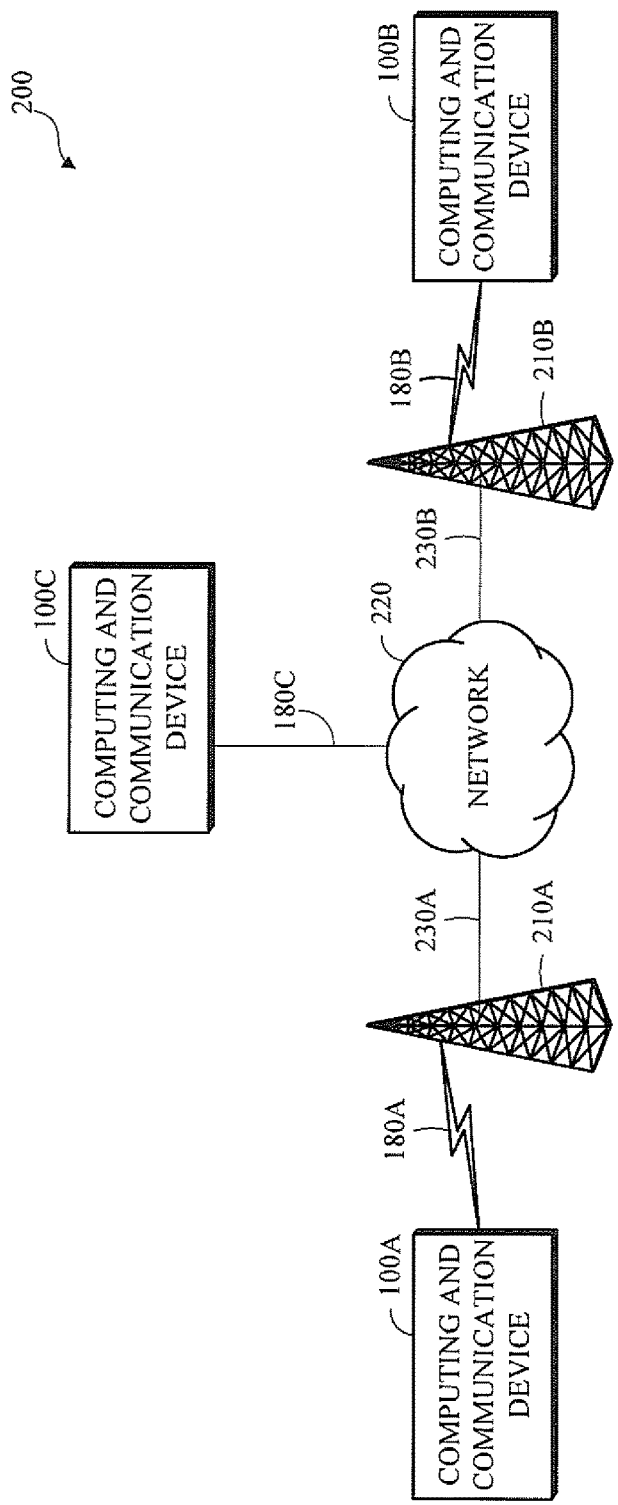
FIG. 2 is a diagram of a computing and communications system in accordance with implementations of this disclosure.

FIG. 2 is a diagram of a computing and communications system 200 in accordance with implementations of this disclosure. The computing and communications system 200 shown includes computing and communication devices 100A, 100B, 100C, access points 210A, 210B, and a network 220. For example, the computing and communication system 200 can be a multiple access system that provides communication, such as voice, audio, data, video, messaging, broadcast, or a combination thereof, to one or more wired or wireless communicating devices, such as the computing and communication devices 100A, 100B, 100C. Although, for simplicity, FIG. 2 shows three computing and communication devices 100A, 100B, 100C, two access points 210A, 210B, and one network 220, any number of computing and communication devices, access points, and networks can be used.

A computing and communication device 100A, 100B, 100C can be, for example, a computing device, such as the computing device 100 shown in FIG. 1. For example, the computing and communication devices 100A, 100B may be user devices, such as a mobile computing device, a laptop, a thin client, or a smartphone, and the computing and communication device 100C may be a server, such as a mainframe or a cluster. Although the computing and communication device 100A and the computing and communication device 100B are described as user devices, and the computing and communication device 100C is described as a server, any computing and communication device may perform some or all of the functions of a server, some or all of the functions of a user device, or some or all of the functions of a server and a user device. For example, the server computing and communication device 100C may receive, encode, process, store, transmit, or a combination thereof audio data and one or both of the computing and communication device 100A and the computing and communication device 100B may receive, decode, process, store, present, or a combination thereof the audio data.

Each computing and communication device 100A, 100B, 100C, which may include a user equipment (UE), a mobile station, a fixed or mobile subscriber unit, a cellular telephone, a personal computer, a tablet computer, a server, consumer electronics, or any similar device, can be configured to perform wired or wireless communication, such as via the network 220. For example, the computing and communication devices 100A, 100B, 100C can be configured to transmit or receive wired or wireless communication signals. Although each computing and communication device 100A, 100B, 100C is shown as a single unit, a computing and communication device can include any number of interconnected elements.

Each access point 210A, 210B can be any type of device configured to communicate with a computing and communication device 100A, 100B, 100C, a network 220, or both via wired or wireless communication links 180A, 180B, 180C. For example, an access point 210A, 210B can include a base station, a base transceiver station (BTS), a Node-B, an enhanced Node-B (eNode-B), a Home Node-B (HNode-B), a wireless router, a wired router, a hub, a relay, a switch, or any similar wired or wireless device. Although each access point 210A, 210B is shown as a single unit, an access point can include any number of interconnected elements.

The network 220 can be any type of network configured to provide services, such as voice, data, applications, voice over internet protocol (VoIP), or any other communications protocol or combination of communications protocols, over a wired or wireless communication link. For example, the network 220 can be a local area network (LAN), wide area network (WAN), virtual private network (VPN), a mobile or cellular telephone network, the Internet, or any other means of electronic communication. The network can use a communication protocol, such as the transmission control protocol (TCP), the user datagram protocol (UDP), the internet protocol (IP), the real-time transport protocol (RTP) the HyperText Transport Protocol (HTTP), or a combination thereof.

The computing and communication devices 100A, 100B, 100C can communicate with each other via the network 220 using one or more a wired or wireless communication links, or via a combination of wired and wireless communication links. For example, as shown the computing and communication devices 100A, 100B can communicate via wireless communication links 180A, 180B, and computing and communication device 100C can communicate via a wired communication link 180C. Any of the computing and communication devices 100A, 100B, 100C may communicate using any wired or wireless communication link, or links. For example, a first computing and communication device 100A can communicate via a first access point 210A using a first type of communication link, a second computing and communication device 100B can communicate via a second access point 210B using a second type of communication link, and a third computing and communication device 100C can communicate via a third access point (not shown) using a third type of communication link. Similarly, the access points 210A, 210B can communicate with the network 220 via one or more types of wired or wireless communication links 230A, 230B. Although FIG. 2 shows the computing and communication devices 100A, 100B, 100C in communication via the network 220, the computing and communication devices 100A, 100B, 100C can communicate with each other via any number of communication links, such as a direct wired or wireless communication link.

In some implementations, communications between one or more of the computing and communication device 100A, 100B, 100C may omit communicating via the network 220, and may include transferring data via another medium (not shown), such as a data storage device. For example, the server computing and communication device 100C may store audio data, such as encoded audio data, in a data storage device, such as a portable data storage unit, and one or both of the computing and communication device 100A or the computing and communication device 100B may access, read, or retrieve the stored audio data from the data storage unit, such as by physically disconnecting the data storage device from the server computing and communication device 100C and physically connecting the data storage device to the computing and communication device 100A or the computing and communication device 100B.

Other implementations of the computing and communications system 200 are possible. For example, in an implementation, the network 220 can be an ad-hoc network and can omit one or more of the access points 210A, 210B. The computing and communications system 200 may include devices, units, or elements not shown in FIG. 2. For example, the computing and communications system 200 may include many more communicating devices, networks, and access points.

Figure 3:
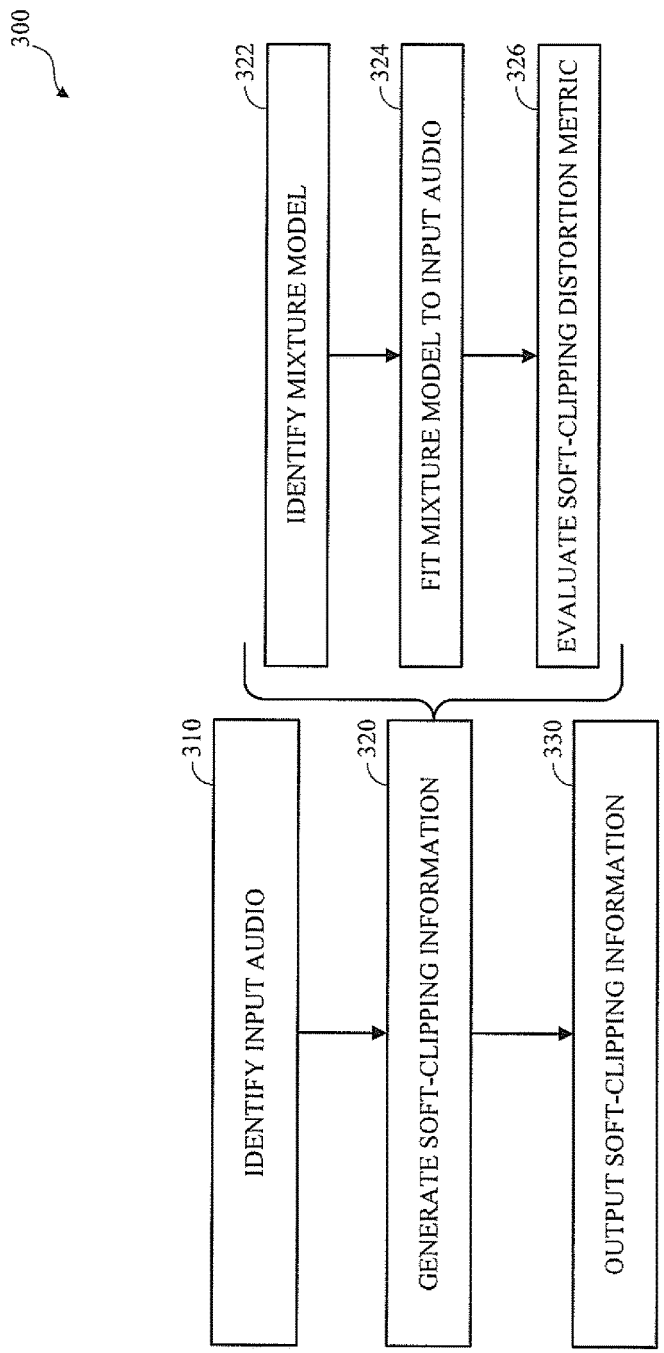
FIG. 3 is a flowchart diagram of an example of mixture model based soft-clipping detection in accordance with implementations of this disclosure.

FIG. 3 is a flowchart diagram of an example of mixture model based soft-clipping detection 300 in accordance with implementations of this disclosure. Mixture model based soft-clipping detection 300 may be implemented in a soft-clipping detection unit, which may be, or may be included in, a computing device, such as the computing device 100 shown in FIG. 1 or one of the computing and communication devices 100A, 100B, 100C shown in FIG. 2. For example, the soft-clipping detection unit may be a unit of a digital signal processor.

Mixture model based soft-clipping detection 300 may include identifying input audio at 310, generating soft-clipping information at 320, outputting the soft-clipping information at 330, or any combination thereof.

Input audio may be identified, such as received or otherwise accessed, at 310. For example, an input data signal that includes input audio, such as an input audio signal or an audio component of an input video signal, may be received, or otherwise accessed by the soft-clipping detection unit. The input audio may include audio samples. The input audio may have a temporal duration.

In some implementations, the input data signal may be an encoded input data signal and identifying the input audio at 310 may include decoding the input audio, or otherwise accessing input audio samples from the input data signal. In some implementations, identifying the input audio at 310 may include identifying a portion of the input audio.

Soft-clipping information may be generated at 320. For example, the soft-clipping detection unit may process, analyze, or evaluate the input audio identified at 310 by performing mixture model based soft-clipping detection to generate the soft-clipping information at 320. The soft-clipping information generated at 320 may indicate whether the input audio identified at 310, or a portion thereof, includes soft-clipping distortion.

Generating the soft-clipping information at 320 may include identifying a mixture model at 322, fitting the mixture model to the input audio at 324, evaluating a soft-clipping distortion metric at 326, or a combination thereof.

A mixture model may be identified at 322. A mixture model for soft-clipping detection may include a probabilistic model representing a probability distribution, which may indicate a respective probability of occurrence for each available value for a data signal, such as audio signal amplitude values. A mixture model for soft-clipping detection may represent statistically relatable portions, or subpopulations, of the data, or population, of an input data signal, wherein the respective samples, or observations, of the data omit information expressly indicating subpopulation associations.

Identifying the mixture model at 322 may include identifying a combination, such as a weighted combination, of mixtures, which may be restricted mixtures. Each mixture of the mixture model may be represented by a respective probability distribution. For example, identifying the mixture model may include identifying a weighted combination of a Laplacian distribution and two Gaussian distributions. The mixture model may have variable parameters, or features, such as a weight (W) of a respective mixture, a standard deviation (σ) of a respective mixture, a mean (μ) of a respective mixture, or a combination thereof.

The Laplacian distribution may be restricted as having a defined mean of zero (zero mean). A standard deviation of the Laplacian distribution ($\sigma_L$), a weight of the Laplacian distribution ($W_L$), or both, may be variable parameters, or features, of the mixture model. The Laplacian distribution may represent or correspond to a distribution of audible speech in the audio signal.

The Gaussian distributions may be restricted as being symmetrical. The respective standard deviations of the Gaussian distributions may be equivalent, the respective weights of the Gaussian distributions may be equivalent, and the respective means of the Gaussian distributions may be opposite. For example, the respective means of the Gaussian distributions may have equivalent magnitude, or absolute value, and opposite sign. For simplicity, the symmetrical Gaussian distributions may be described herein using the singular form, unless otherwise expressly indicated or otherwise unambiguously distinguished by context. The weight of the Gaussian distribution ($W_G$), the mean of the Gaussian distribution ($\mu_G$), the standard deviation of the Gaussian distribution ($\sigma_G$), or a combination thereof may be variable parameters, or features, of the mixture model. The Gaussian distributions may represent or correspond to a distribution of soft-clipped samples in the audio signal.

Although the mixture model is described herein as a weighted combination of a Laplacian distribution and two Gaussian distributions, other combinations may be used. For example, the zero mean Laplacian distribution may be combined with an additive zero mean Gaussian distribution, which may have independent weight and deviation, and which may model non-speech audio at the center or origin of the distribution. In another example, the Laplacian distribution may be omitted, and the center of the audio distribution may be modeled using a generalized Gaussian distribution.

In some implementations, identifying the mixture model at 322 may include identifying candidate mixture models, such as a first candidate mixture model including a restricted, zero mean, Laplacian distribution to model the center of the audio distribution as described herein, and a second candidate mixture model including a restricted, zero mean, Gaussian distribution to model the center of the audio distribution.

Identifying the mixture model at 322 may include identifying defined, such as previously identified or stored, values for respective parameters of the mixture model. For example, identifying the mixture model at 322 may include identifying a defined weight for the Laplacian distribution and a corresponding defined weight for the Gaussian distributions, identifying a defined standard deviation for the Laplacian distribution, identifying a defined standard deviation for the Gaussian distribution, identifying a defined mean for the Gaussian distribution, or a combination thereof.

In some implementations, the defined values for the respective parameters of the mixture model may be identified, such as randomly or pseudo-randomly, from defined parameter ranges. For example, a defined value for the Gaussian weight may be randomly identified from the range 0.1 to 0.2, a defined value for the Gaussian mean may be randomly identified from the range 0.3 to 0.7, a defined value for the Gaussian standard deviation may be randomly identified from the range 0.1 to 0.2, and a defined value for the Laplacian standard deviation may be randomly identified from the range 0.1 to 0.5.

The mixture model may be fit to the input audio at 324. Fitting the mixture model to the input audio at 324 may include generating a fitted mixture model having fitted parameters by adjusting, or modifying, the parameters of the mixture model, such as the weight of the Gaussian distribution of the fitted mixture model, the mean of the Gaussian distribution of the fitted mixture model, the standard deviation of the Gaussian distribution of the fitted mixture model, the standard deviation of the Laplacian distribution of the fitted mixture model, or a combination thereof, to identify parameters that maximize the probability of the mixture model predicting the distribution of the samples of the input audio identified at 310.

For example, the fitted mixture model may be generated using expectation maximization, or another applicable method of mixture model fitting. Fitting the mixture model to the input audio using expectation maximization may include repeated iterations of predicting probability distributions based on current parameters and revising the current parameters based on the predicted probability distributions.

In some embodiments, the mixture model may include a generalized Gaussian distribution for modeling the center distribution and fitting the mixture model may include iteratively estimating a shape parameter for the generalized Gaussian distribution using gamma functions.

In some implementations, candidate mixture models may be fitted to the input audio, and the fitted candidate mixture model that minimizes prediction error may be identified as the fitted mixture model for the input audio.

In some implementations, fitting the mixture model at 324 may include identifying target samples from the input audio signal and fitting the mixture model to the target samples. For example, the input audio signal may include hard-clipped samples, samples representing background noise, or both, and the target samples may be identified as the samples from the input audio signal other than the hard-clipped samples or the samples representing background noise.

In some implementations, fitting the mixture model at 324 may include identifying a defined cardinality, number, or count, of input audio quantiles from the input audio samples, and fitting the mixture model to the input audio quantiles.

A soft-clipping distortion metric may be evaluated at 326, such as based on the parameters of the fitted mixture model identified at 324. For example, the soft clipping distortion metric may indicate defined relationships between the respective fitted parameters that correspond with soft-clipping distortion. Evaluating the soft clipping distortion metric may include generating soft-clipping information indicating whether the input data signal includes soft clipping distortion, generating soft-clipping information including a soft-clipping distortion value indicating a severity, or harshness, of the soft-clipping distortion, or both.

In an example, the mean of the Gaussian distribution of the fitted mixture model may exceed, such as be greater than, a multiple of the standard deviation of the Gaussian distribution of the fitted mixture model, such as three times the standard deviation of the Gaussian distribution of the fitted mixture model, which may be expressed as ($\mu_G > 3\sigma_G$), the mean of the Gaussian distribution of the fitted mixture model may exceed a multiple of the standard deviation of the Laplacian distribution of the fitted mixture model, such as twice the standard deviation of the Laplacian distribution of the fitted mixture model, which may be expressed as ($\mu_G > 2\sigma_L$), and the input audio signal may be identified as including soft-clipping distortion.

For input audio signals that include soft-clipping distortion, evaluating the soft clipping distortion metric may include identifying a soft-clipping distortion value. For example, a multiple of the weight of the Gaussian distribution, such as twice the weight of the Gaussian distribution, may be identified as the soft-clipping distortion value, which may represent a ratio of soft-clipped samples for the input audio signal. For input audio signals identified as omitting soft-clipping distortion, identifying a soft-clipping distortion value may be omitted.

In some implementations, evaluating the soft clipping distortion metric at 326 may include evaluating the fitted mixture model parameters using a machine learning model, or algorithm, which may include clustering training data in a four-dimensional space of mixture model features. For example, a machine learning model, such as a linear logistic regression model or a support vector machine (SVM) model, may be trained on mixture models fitted to training audio signals. In some implementations, the training audio signals may be manually labeled to indicate the inclusion and severity of soft-clipping distortion, or the absence thereof. The machine learning model may be trained to predict the inclusion and severity of soft-clipping distortion in an input audio signal based on the parameters of a corresponding fitted mixture model.

Although not shown separately in FIG. 3, mixture model based soft-clipping detection 300 may include identifying a sequence of temporal portions from the input audio signal, such as one-second portions, identifying soft clipping information at 320 for each respective temporal portion of the input audio signal, and may include identifying aggregate soft-clipping information, relative soft-clipping information, or both. Aggregate soft-clipping information may include information for the input audio signal based on respective soft-clipping information generated for the respective temporal portions of the input audio signal, such as an average soft-clipping distortion value or a maximum soft-clipping distortion value. Relative soft-clipping information may indicate soft-clipping information for a temporal portion of the input audio signal relative to corresponding aggregate soft-clipping information for the input audio signal, or relative to corresponding soft-clipping information for the input audio signal.

The soft-clipping information may be output at 330. For example, the soft-clipping information may be transmitted to another device or stored in a data storage unit in association with the input audio signal.

In some implementations, outputting the soft-clipping information at 330 may include generating and sending information, such as a message, to an account or user associated with the input audio signal indicating that the input audio signal includes soft-clipping distortion, which may include indicating the severity of the soft clipping distortion.

In some implementations, soft-clipping information may be generated for multiple input audio signals. For example, respective soft-clipping information may be generated for one or more input audio signals from a set of input audio signals and a percentage, or other measure, of the proportion or number of input audio signals that include soft-clipping distortion may be identified.

In some implementations, outputting the soft-clipping information at 330 may include outputting the soft-clipping information to a declipping filter for use in minimizing, or reducing, the soft-clipping distortion.

Other implementations of mixture model based soft-clipping detection are available. In implementations, additional elements of mixture model based soft-clipping detection can be added, certain elements can be combined, and/or certain elements can be removed.

Figure 4:
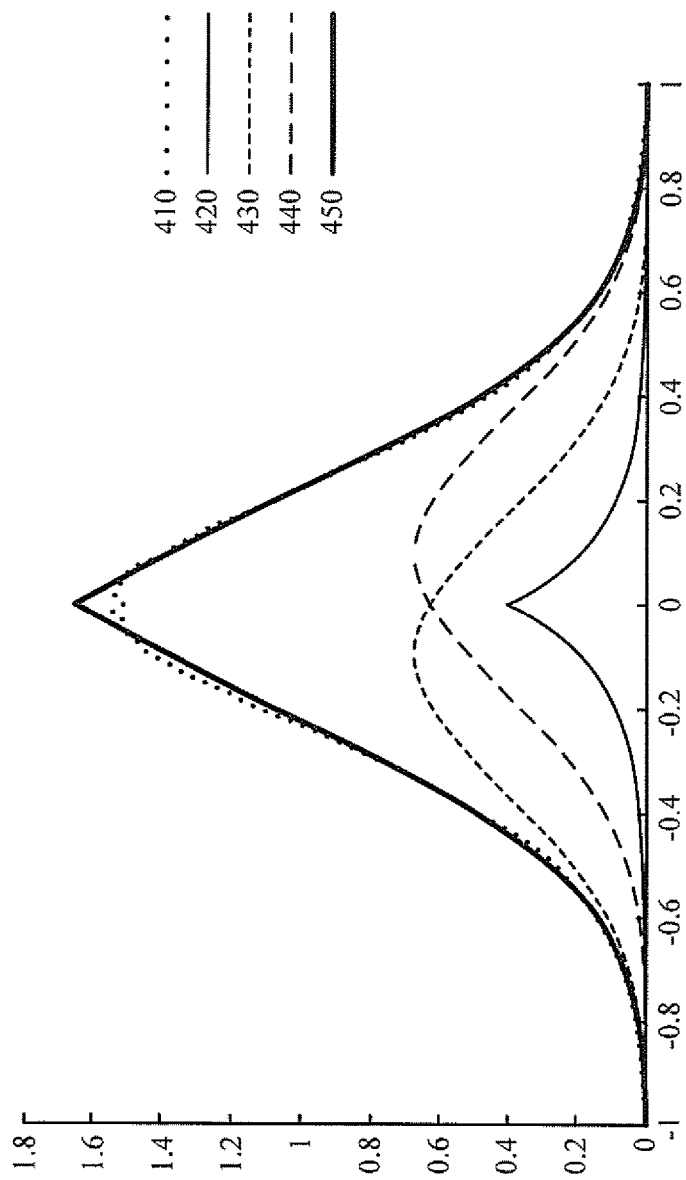
FIG. 4 is a diagram of an example of a fitted mixture model for an input audio signal omitting soft-clipping in accordance with implementations of this disclosure.

FIG. 4 is a diagram of an example of a fitted mixture model for an input audio signal omitting soft-clipping in accordance with implementations of this disclosure. For example, the fitted mixture model shown in FIG. 4 may be generated using mixture model based soft-clipping detection, such as the mixture model based soft-clipping detection 300 shown in FIG. 3, based on an input audio signal, which may include identifying soft-clipping information indicating an absence of soft-clipping distortion in the input audio signal.

The diagram shown in FIG. 4 includes a histogram 410 of the input audio signal, shown using a dotted line, a Laplacian distribution 420 component of the fitted mixture model, shown using a thin solid line, a first Gaussian distribution 430 component of the fitted mixture model, shown using a short-dash broken line, a second Gaussian distribution 440 component of the fitted mixture model, shown using a long-dash broken line, and the fitted mixture model 450, shown using a thick solid line.

The Gaussian distributions 430, 440 are relatively near the center of the input distribution and have relatively broad standard deviation.

Figure 5:
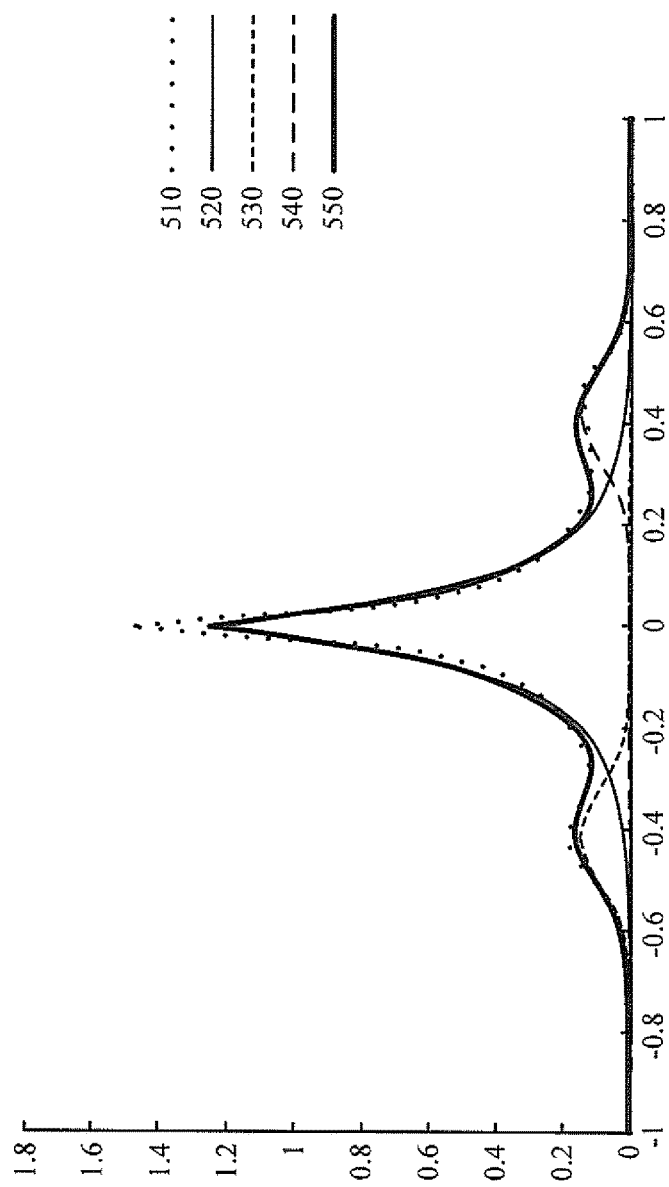
FIG. 5 is a diagram of an example of a fitted mixture model for an input audio signal including soft-clipping and omitting hard-clipping in accordance with implementations of this disclosure.

FIG. 5 is a diagram of an example of a fitted mixture model for an input audio signal including soft-clipping and omitting hard-clipping in accordance with implementations of this disclosure. For example, the fitted mixture model shown in FIG. 5 may be generated using mixture model based soft-clipping detection, such as the mixture model based soft-clipping detection 300 shown in FIG. 3, based on an input audio signal, which may include identifying soft-clipping information indicating the inclusion of soft-clipping distortion in the input audio signal and indicating a relatively low soft-clipping distortion severity.

The diagram shown in FIG. 5 includes a histogram 510 of the input audio signal, shown using a dotted line, a Laplacian distribution 520 component of the fitted mixture model, shown using a thin solid line, a first Gaussian distribution 530 component of the fitted mixture model, shown using a short-dash broken line, a second Gaussian distribution 540 component of the fitted mixture model, shown using a long-dash broken line, and the fitted mixture model 550, shown using a thick solid line.

The peaks of Gaussian distributions 530, 540 and the proximate local peaks of the fitted mixture model 550 correspond with the soft-clipping distortion. Although the histogram 510 shown in FIG. 5 includes local peaks proximate to the peaks of Gaussian distributions 530, 540, a histogram of an input audio signal that includes soft-clipping distortion may omit local peaks corresponding to the soft-clipping distortion.

Figure 6:
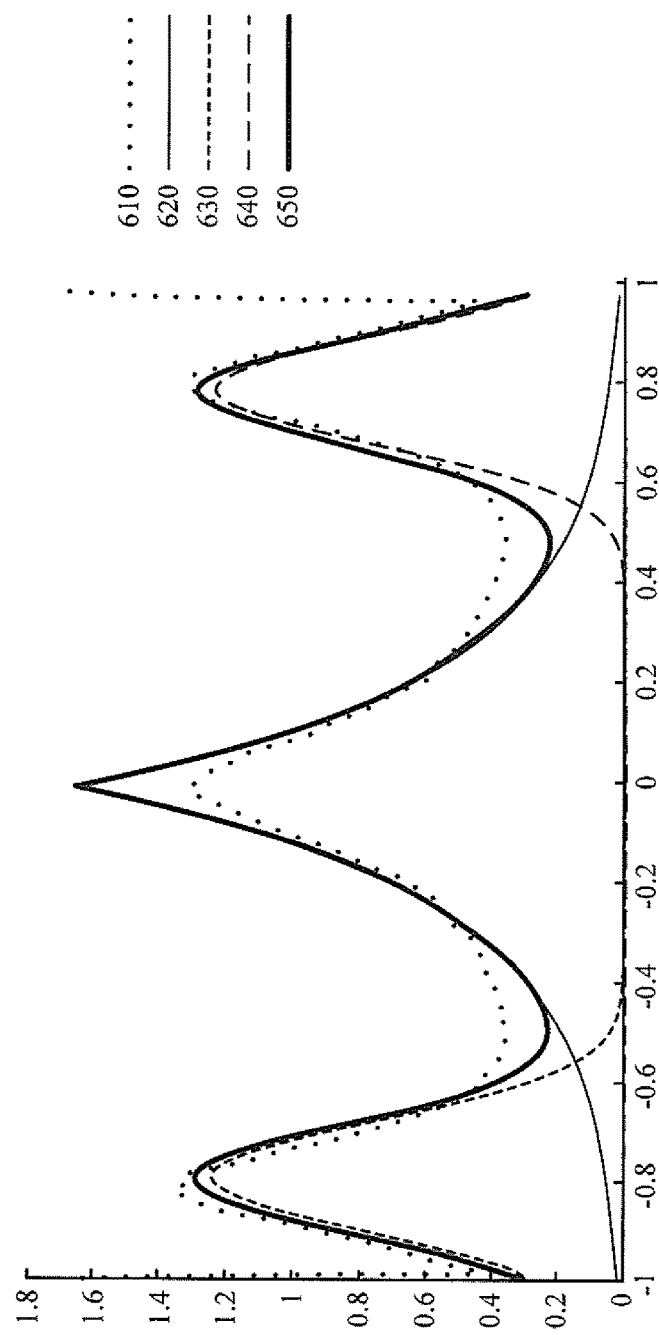
FIG. 6 is a diagram of an example of a fitted mixture model for an input audio signal including soft-clipping and hard-clipping in accordance with implementations of this disclosure.

FIG. 6 is a diagram of an example of a fitted mixture model for an input audio signal including soft-clipping and hard-clipping in accordance with implementations of this disclosure. For example, the fitted mixture model shown in FIG. 6 may be generated using mixture model based soft-clipping detection, such as the mixture model based soft-clipping detection 300 shown in FIG. 3, based on an input audio signal, which may include identifying soft-clipping information indicating the inclusion of soft-clipping distortion in the input audio signal and indicating a relatively high soft-clipping distortion severity.

The diagram shown in FIG. 6 includes a histogram 610 of the input audio signal, shown using a dotted line, a Laplacian distribution 620 component of the fitted mixture model, shown using a thin solid line, a first Gaussian distribution 630 component of the fitted mixture model, shown using a short-dash broken line, a second Gaussian distribution 640 component of the fitted mixture model, shown using a long-dash broken line, and the fitted mixture model 650, shown using a thick solid line.

The histogram 610 includes relatively high peaks at the left and right ends respectively, indicating hard-clipping distortion. The peaks of Gaussian distributions 630, 640 and the proximate local peaks of the fitted mixture model 650 correspond with the soft-clipping distortion. The fitted mixture model 650 omits peaks corresponding to the hard-clipping distortion.

The words "example" or "exemplary" are used herein to mean serving as an example, instance, or illustration. Any aspect or design described herein as "example" or "exemplary" not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. As used herein, the terms "determine" and "identify", or any variations thereof, include selecting, ascertaining, computing, looking up, receiving, determining, establishing, obtaining, or otherwise identifying or determining in any manner whatsoever using one or more of the devices shown in FIG. 1.

Further, for simplicity of explanation, although the figures and descriptions herein may include sequences or series of steps or stages, elements of the methods disclosed herein can occur in various orders and/or concurrently. Additionally, elements of the methods disclosed herein may occur with other elements not explicitly presented and described herein. Furthermore, one or more elements of the methods described herein may be omitted from implementations of methods in accordance with the disclosed subject matter.

The implementations of the transmitting computing and communication device 100A and/or the receiving computing and communication device 100B (and the algorithms, methods, instructions, etc. stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors or any other suitable circuit. In the claims, the term "processor" should be understood as encompassing any of the foregoing hardware, either singly or in combination. The terms "signal" and "data" are used interchangeably. Further, portions of the transmitting computing and communication device 100A and the receiving computing and communication device 100B do not necessarily have to be implemented in the same manner.

Further, in one implementation, for example, the transmitting computing and communication device 100A or the receiving computing and communication device 100B can be implemented using a computer program that, when executed, carries out any of the respective methods, algorithms and/or instructions described herein. In addition or alternatively, for example, a special purpose computer/processor can be utilized which can contain specialized hardware for carrying out any of the methods, algorithms, or instructions described herein.

The transmitting computing and communication device 100A and receiving computing and communication device 100B can, for example, be implemented on computers in a real-time communication system. Alternatively, the transmitting computing and communication device 100A can be implemented on a server and the receiving computing and communication device 100B can be implemented on a device separate from the server, such as a hand-held communications device. Other suitable transmitting computing and communication device 100A and receiving computing and communication device 100B implementation schemes are available. For example, the receiving computing and communication device 100B can be a generally stationary personal computer rather than a portable communications device.

Further, all or a portion of implementations can take the form of a computer program product accessible from, for example, a tangible computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described implementations have been described in order to allow easy understanding of the application are not limiting. On the contrary, the application covers various modifications and equivalent arrangements included within the scope of the appended claims, which scope is to be accorded the broadest interpretation so as to encompass all such modifications and equivalent structure as is permitted under the law.

What is claimed is:

1. A method comprising: receiving input audio samples; generating soft-clipping information indicating whether the input audio samples include soft-clipping distortion, wherein generating the soft-clipping information includes: fitting a mixture model to the input audio samples, wherein fitting the mixture model to the input audio samples includes generating a fitted mixture model, such that the fitted mixture model has fitted parameters; and evaluating a soft-clipping distortion metric based on the parameters of the fitted mixture model, wherein evaluating the soft-clipping distortion metric includes identifying a soft-clipping distortion value; and outputting the soft-clipping information; wherein the fitted mixture model includes: a Laplacian distribution having a zero mean; a first Gaussian distribution; and a second Gaussian distribution, wherein the first Gaussian distribution and the second distribution are symmetrical.

2. The method of claim 1, wherein evaluating the soft-clipping distortion metric includes:
   evaluating the soft-clipping distortion metric using a trained machine learning model.

3. The method of claim 1, wherein generating the soft-clipping information includes:

identifying a sequence of temporal portions of the input audio samples; and fitting the mixture model to the input audio samples by:
for each temporal portion from the sequence of temporal portions:
fitting the mixture model to the respective temporal portion; and
generating respective soft-clipping information for each respective temporal portion.

4. A method comprising: receiving an input data signal, wherein the input data signal includes input audio samples; generating soft-clipping information indicating whether the input audio samples include soft-clipping distortion, wherein generating the soft-clipping information includes: fitting a mixture model to the input audio samples; and outputting the soft-clipping information; wherein the mixture model is a restricted mixture model; wherein the restricted mixture model includes: a Laplacian distribution having a zero mean; a first Gaussian distribution; and a second Gaussian distribution, wherein the first Gaussian distribution and the second Gaussian distribution are symmetrical.

5. The method of claim 4, wherein fitting the mixture model to the input audio samples includes:
fitting the mixture model to the input audio samples using expectation maximization.

6. The method of claim 4, wherein fitting the mixture model to the input audio samples includes:
generating a fitted mixture model, such that parameters of the fitted mixture model include:
a weight of a Gaussian distribution of the fitted mixture model;
a mean of the Gaussian distribution of the fitted mixture model;
a standard deviation of the Gaussian distribution of the fitted mixture model; and
a standard deviation of a Laplacian distribution of the fitted mixture model.

7. The method of claim 6, wherein generating the soft-clipping information includes:
evaluating a soft-clipping distortion metric based on the parameters of the fitted mixture model.

8. The method of claim 7, wherein evaluating the soft-clipping distortion metric includes:
generating an indication that the input audio samples include soft-clipping distortion in response to a determination that the mean of the Gaussian distribution of the fitted mixture model exceeds a first multiple of the standard deviation of the Gaussian distribution of the fitted mixture model and that the mean of the Gaussian distribution of the fitted mixture model exceeds a second multiple of the standard deviation of the Laplacian distribution of the fitted mixture model.

9. The method of claim 8, wherein the first multiple is three and the second multiple is two.

10. The method of claim 7, wherein evaluating the soft-clipping distortion metric includes:
identifying a soft-clipping distortion value indicating a severity of the soft-clipping distortion.

11. The method of claim 10, wherein identifying the soft-clipping distortion value includes:
identifying a third multiple of the weight of the Gaussian distribution of the fitted mixture model as the soft-clipping distortion value.

12. The method of claim 11, wherein the third multiple is two.

13. The method of claim 10, wherein identifying the soft-clipping distortion value includes:
identifying, as the soft-clipping distortion value, a result of evaluating the parameters of the fitted mixture model using a machine learning model.

14. The method of claim 4, wherein fitting the mixture model to the input audio samples includes:
identifying a defined cardinality of input audio quantiles from the input audio samples; and
fitting the mixture model to the input audio quantiles.

15. The method of claim 4, wherein fitting the mixture model to the input audio samples includes:
identifying hard-clipped audio samples from the input audio samples;
identifying background audio samples from the input audio samples;
identifying target audio samples including the input audio samples other than the hard-clipped audio samples and the background audio samples; and
fitting the mixture model to the target audio samples.

16. The method of claim 4, wherein generating the soft-clipping information includes:
identifying a sequence of temporal portions of the input audio samples; and
fitting the mixture model to the input audio samples by:
for each temporal portion from the sequence of temporal portions:
fitting the mixture model to the respective temporal portion; and
generating soft-clipping information indicating whether the respective temporal portion includes soft-clipping distortion.

17. The method of claim 4, wherein the input data signal is an audio signal or an audio signal component of a video signal.

18. A method comprising:
receiving an input data signal, wherein the input data signal includes input audio samples;
generating soft-clipping information for the input data signal, wherein generating the soft-clipping information includes:
identifying a mixture model including:
a Laplacian distribution having a zero mean;
a first Gaussian distribution; and
a second Gaussian distribution, wherein the first Gaussian distribution and the second Gaussian distribution are symmetrical;
identifying a sequence of temporal portions of the input audio samples;
for each temporal portion from the sequence of temporal portions:
generating a respective fitted mixture model by fitting the mixture model to the respective input audio samples from the temporal portion using expectation maximization;
generating respective soft-clipping information indicating whether the temporal portion includes soft-clipping distortion by evaluating a soft-clipping distortion metric based on parameters of the respective fitted mixture model, wherein, in response to a determination that the temporal portion includes soft-clipping distortion, generating the respective soft-clipping information includes identifying a respective soft-clipping distortion value indicating a severity of the soft-clipping distortion for the respective input audio samples from the temporal portion; and including the respective soft-clipping information for the temporal portion in the soft-clipping information for the input data signal;
generating an average soft-clipping distortion value for the input data signal;
including the average soft-clipping distortion value for the input data signal in the soft-clipping information for the input data signal;
identifying a maximum soft-clipping distortion value for the input data signal; and
including the maximum soft-clipping distortion value for the input data signal in the soft-clipping information for the input data signal; and
outputting the soft-clipping information for the input data signal.

* * * * *